United States Patent
Wang et al.

(10) Patent No.: US 9,541,611 B2
(45) Date of Patent: Jan. 10, 2017

(54) STRUCTURE FOR MOUNTING HALL EFFECT SENSOR OF MOTOR

(71) Applicant: Zhongshan Broad-Ocean Motor Co., Ltd., Zhongshan (CN)

(72) Inventors: Xiongcheng Wang, Zongshan (CN); Guiwen Fu, Zhongshan (CN); Yueqiang Yu, Zhongshan (CN)

(73) Assignee: ZHONGSHAN BROAD-OCEAN MOTOR CO., LTD., Zhongshan (CN)

( * ) Notice: Subject to any disclaimer, the term of this patent is extended or adjusted under 35 U.S.C. 154(b) by 11 days.

(21) Appl. No.: 14/825,192

(22) Filed: Aug. 13, 2015

(65) Prior Publication Data

US 2015/0346292 A1 Dec. 3, 2015

Related U.S. Application Data

(63) Continuation-in-part of application No. PCT/CN2014/074172, filed on Mar. 27, 2014.

(30) Foreign Application Priority Data

Nov. 8, 2013 (CN) ............... 2013 2 0705788 U
Nov. 30, 2013 (CN) ............... 2013 2 0779542 U

(51) Int. Cl.
| | | |
|---|---|---|
| *G01R 33/07* | (2006.01) | |
| *G01B 7/30* | (2006.01) | |
| *G01R 33/00* | (2006.01) | |
| *H02K 3/52* | (2006.01) | |
| *H02K 5/00* | (2006.01) | |
| *H02K 5/15* | (2006.01) | |

(52) U.S. Cl.
CPC ......... *G01R 33/072* (2013.01); *G01R 33/0047* (2013.01); *G01R 33/07* (2013.01); *H02K 3/522* (2013.01); *H02K 5/00* (2013.01); *H02K 5/15* (2013.01); *H02K 11/215* (2016.01)

(58) Field of Classification Search
CPC ..................................................... G01R 33/07
USPC ......................................................... 324/251
See application file for complete search history.

(56) References Cited

U.S. PATENT DOCUMENTS

| | | | | |
|---|---|---|---|---|
| 4,533,902 A | * | 8/1985 | Baker et al. ................. | 341/9 |
| 6,701,892 B2 | * | 3/2004 | Hashimoto et al. .......... | 123/399 |
| 2006/0001417 A1 | * | 1/2006 | Clark ............................. | 324/174 |
| 2006/0274485 A1 | * | 12/2006 | Godoy et al. ................. | 361/622 |
| 2009/0027045 A1 | * | 1/2009 | Islam et al. .................. | 324/207.13 |
| 2013/0200888 A1 | * | 8/2013 | Kim et al. ..................... | 324/207.25 |

* cited by examiner

*Primary Examiner* — Bot Ledynh
(74) *Attorney, Agent, or Firm* — Matthias Scholl, PC; Matthias Scholl

(57) ABSTRACT

A structure for mounting a Hall effect sensor, the structure including: a mounting bracket, a mounting plate, a left supporting column, a right supporting column, and a first supporting column. The left supporting column and the right supporting column are protruded upwards from top surfaces of two adjacent teeth at the inner side of a certain winding slot, respectively. The first supporting column is protruded upwards from the top surface of the circular yoke at the outer side of the winding slot. The mounting plate is disposed on top surfaces of the first supporting column, the left supporting column, and the right supporting column. The mounting bracket is installed at the bottom of the mounting plate. The Hall effect sensor is installed in the mounting bracket.

15 Claims, 11 Drawing Sheets

STRUCTURE FOR MOUNTING HALL EFFECT SENSOR OF MOTOR

CROSS-REFERENCE TO RELATED APPLICATIONS

This application is a continuation-in-part of International Patent Application No. PCT/CN2014/074172 with an international filing date of Mar. 27, 2014, designating the United States, now pending, and further claims priority benefits to Chinese Patent Application No. 201320705788.7 filed Nov. 8, 2013, and to Chinese Patent Application No. 201320779542.4 filed Nov. 30, 2013. The contents of all of the aforementioned applications, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, Mass. 02142.

BACKGROUND OF THE INVENTION

Field of the Invention

The invention relates to a structure for mounting a Hall effect sensor of a motor.

Description of the Related Art

Typically, a Hall effect sensor is installed on the control circuit board of a motor, and then the control circuit board is mounted on the end insulator of the stator assembly or the rear end cover of the motor. However, such installation is unreliable, the control circuit board is difficult to position, and the Hall effect sensor tends to detach from the control circuit board.

SUMMARY OF THE INVENTION

In view of the above-described problems, it is one objective of the invention to provide a structure for mounting a Hall effect sensor of a motor. The structure is simple and compact, the installation is convenient and firm, and the working reliability is high. The creepage distance between the Hall effect sensor and the coil windings can be enlarged, and the Hall effect sensor is high voltage resistant and difficult to breakdown.

To achieve the above objective, in accordance with one embodiment of the invention, there is provided a structure for mounting a Hall effect sensor of a motor. The motor comprises: a rotating shaft, a rotor assembly, a stator assembly, a housing assembly, and a Hall effect sensor. The stator assembly comprises: an iron core, an end insulation, and coil windings. The end insulation comprises: a circular yoke, a plurality of teeth, and winding slots. The housing assembly comprising a first cavity. The rotor assembly is disposed on the rotating shaft. The rotor assembly is nested within the stator assembly, and the rotor assembly and the stator assembly are disposed in the first cavity of the housing assembly. The end insulation is disposed on an end part of the iron core, and the coil windings are wound on the end insulation. The teeth are protruded inwards from the circular yoke, and winding slots are formed between two adjacent teeth. The structure for mounting the Hall effect sensor comprises: a mounting bracket, a mounting plate, a left supporting column, a right supporting column, and a first supporting column. The left supporting column and the right supporting column are protruded upwards from top surfaces of two adjacent teeth at an inner side of a certain winding slot, respectively. The first supporting column is protruded upwards from a top surface of the circular yoke at an outer side of the winding slot. The mounting plate is disposed on top surfaces of the first supporting column, the left supporting column, and the right supporting column. The mounting bracket is installed at a bottom of the mounting plate. The Hall effect sensor is installed in the mounting bracket.

In a class of this embodiment, the mounting bracket comprises a second cavity at a bottom thereof, and the Hall effect sensor is embedded in the second cavity.

In a class of this embodiment, a left base is disposed at a bottom of the left supporting column on the top surface of one tooth. A right base is disposed at a bottom of the right supporting column on the top surface of an adjacent tooth. A mounting slot is formed between the left base and the right base. The mounting bracket is embedded in the mounting slot and disposed on the top surfaces of the teeth.

In a class of this embodiment, an inner wall of the mounting slot, the left base, and the right base form a left neck and a right neck. Two sides of the mounting bracket are convex to form two fixture blocks. The mounting bracket is nested in the mounting slot, and the fixture blocks on the two sides of the mounting bracket are locked in the left neck and the right neck, respectively.

In a class of this embodiment, a plurality of first through holes is disposed at a top of the mounting bracket and communicates with the second cavity. A plurality of second through holes is disposed on the mounting plate for communicating with the first through holes. The Hall effect sensor is embedded in the second cavity, and pins of the Hall effect sensor pass through the first through holes and the second through holes and are in electric connection with an external device.

In a class of this embodiment, a plurality of positioning columns is protruded from a top surface of the mounting bracket. The mounting plate comprises mounting holes. The mounting bracket is mounted at a bottom of the mounting plate by assembling the positioning columns with the mounting holes. the mounting plate comprises a plurality of positioning holes, and the mounting plate is disposed on the top surfaces of the first supporting column, the left supporting column, and the right supporting column by assembling the positioning holes with the first supporting column, the left supporting column, and the right supporting column. The mounting plate also comprises a plurality of lead through holes.

In a class of this embodiment, an inner side panel is protruded upwards from an inner edge of the top surface of each tooth. The left base and the right base are connected to corresponding inner side panels, respectively.

In a class of this embodiment, the housing assembly comprises: a housing, a front end cover and a rear end cover disposed at two ends of the housing, respectively. A middle of a top surface of the front end cover is protruded upwards to form an upper bearing seat. A bearing cavity is disposed in the upper bearing seat. An outer wall of the upper bearing seat is provided with a plurality of first stiffeners. A bottom wall of the bearing cavity is convex downwards from a bottom surface of the front end cover and forms a lower bearing seat. An outer wall of the lower bearing seat is provided with a plurality of second stiffeners.

In a class of this embodiment, the first stiffeners are radially disposed on the top surface of the front end cover. A plurality of through holes for heat dissipation is radially arranged between two adjacent first stiffeners.

In a class of this embodiment, an annular boss is disposed on an outer edge of the top surface of the front end cover, and two ends of the first stiffeners are connected to the outer wall of the upper bearing seat and the annular boss.

In a class of this embodiment, an outer edge of the front end cover protrudes a plurality of mounting feet, two sides of the mounting feet are provided with third stiffeners, and the third stiffeners are connected to the outer edge of the front end cover.

In a class of this embodiment, the number of the mounting feet is four; the mounting feet are radially disposed on the outer edge of the front end cover. The outer edge of the front end cover between two adjacent mounting feet protrudes arc panels, and two sides of each arc panel are connected to the two adjacent mounting feet.

In a class of this embodiment, the rear end cover comprises: a rear bearing seat, and four supporting arms extended from an outer wall of the rear bearing seat. The four supporting arms are arranged in a pattern of the character "X". Two mounting seats are symmetrically disposed at the outer edge of the top surface of the front end cover. Screws pass through the supporting arms and the stator assembly and are inserted into the mounting seats to tightly cooperate with screw nuts whereby fixing the front end cover and the rear end cover on two ends of the housing, respectively.

Advantages according to embodiments of the invention are summarized as follows:

1) The rotor assembly is disposed on the rotating shaft. The rotor assembly is nested within the stator assembly. The cavity is disposed in the middle of the housing assembly, and the rotor assembly and the stator assembly are mounted in the cavity of the housing assembly. The stator assembly comprises: the iron core, the end insulation, and the coil windings. The end insulation is disposed on the end part of the iron core, and the coil windings are wound on the end insulation. The end insulation comprises: the circular yoke, the teeth protruded inwards from the circular yoke, and winding slots formed between two adjacent teeth. The left supporting column and the right supporting column are protruded upwards from top surfaces of two adjacent teeth at the inner side of the certain winding slot, respectively. The first supporting column is protruded upwards from the top surface of the circular yoke at the outer side of the winding slot. The mounting plate is disposed on top surfaces of the first supporting column, the left supporting column, and the right supporting column. The mounting bracket is installed at the bottom of the mounting plate. The Hall effect sensor is installed in the mounting bracket. The structure is simple and compact, the mounting plate, the mounting bracket, and the Hall effect sensor form an assembled structure and the assembled structure is installed on the end insulation, thereby realizing good integrity, convenient and firm installation, and high working stability. The creepage distance between the Hall effect sensor and the coil windings can be enlarged by regulating the relative distance between the mounting plate and the three supporting columns or regulating the relative positions of the mounting bracket and the mounting plate, so that the Hall effect sensor is able to resist high voltage and is difficult to breakdown.

2) The mounting bracket comprises the second cavity at the bottom thereof, and the Hall effect sensor is embedded in the second cavity. The mounting bracket is adapted to protect the Hall effect sensor effectively, thereby ensuring high reliability and preventing the Hall effect sensor from breakdown.

3) The left base is disposed at the bottom of the left supporting column on the top surface of one tooth. The right base is disposed at the bottom of the right supporting column on the top surface of the adjacent tooth. The mounting slot is formed between the left base and the right base. The mounting bracket is embedded in the mounting slot and disposed on the top surfaces of the teeth. The inner wall of the mounting slot, the left base, and the right base form the left neck and the right neck. Two sides of the mounting bracket are convex to form two fixture blocks. The mounting bracket is nested in the mounting slot, and the fixture blocks on the two sides of the mounting bracket are locked in the left neck and the right neck, respectively. The structure is simple, the mounting bracket features simple and firm installation and accurate positioning.

4) The plurality of first through holes is disposed at the top of the mounting bracket and communicates with the second cavity. The plurality of second through holes is disposed on the mounting plate for communicating with the first through holes. The Hall effect sensor is embedded in the second cavity, and pins of the Hall effect sensor pass through the first through holes and the second through holes and are in electric connection with the external device. The structure is simple and facilitates the electric connection between the Hall effect sensor and the control circuit board of the motor.

5) The plurality of positioning columns is protruded from the top surface of the mounting bracket. The mounting plate comprises mounting holes. The mounting bracket is mounted at the bottom of the mounting plate by assembling the positioning columns with the mounting holes. The mounting plate comprises the positioning holes, and the mounting plate is disposed on the top surfaces of the first supporting column, the left supporting column, and the right supporting column by assembling the positioning holes with the first supporting column, the left supporting column, and the right supporting column. The structure is simple, the installation thereof is convenient, firm, and reliable, and the installation efficiency is high.

6) The inner side panel is protruded upwards from the inner edge of the top surface of each tooth. The left base and the right base are connected to corresponding inner side panels, respectively. The structure is simple. The integrity of the left supporting column, the left base, and the inner side panel and the integrity of the right supporting column, the right base, and the inner side panel are improved, and the installation is much firm.

7) The upper bearing seat. The bearing cavity is disposed in the upper bearing seat. The outer wall of the upper bearing seat is provided with the first stiffeners. The bottom wall of the bearing cavity is convex downwards from the bottom surface of the front end cover and forms the lower bearing seat. The outer wall of the lower bearing seat is provided with the second stiffeners. The structure is simple, the integral strength of the front end cover is high, the heat dissipation is excellent, the service lives of the bearing and the motor are improved, and the reliability of the structure is high.

8) The first stiffeners are radially disposed on the top surface of the front end cover. The plurality of through holes for heat dissipation is radially arranged between two adjacent first stiffeners. The through holes for heat dissipation are able to improve the heat dissipation capacity of the front end cover as well as decrease the noise produced during the operation of the motor.

9) The annular boss is disposed on the outer edge of the top surface of the front end cover, and two ends of the first stiffeners are connected to the outer wall of the upper bearing seat and the annular boss. The outer edge of the front end cover protrudes the mounting feet, two sides of the mounting feet are provided with third stiffeners, and the third stiffeners are connected to the outer edge of the front end cover. The structure is simple, the integral strength of the front end cover is improved, and the service life thereof is prolonged.

10) The number of the mounting feet is four; the mounting feet are radially disposed on the outer edge of the front end cover. The outer edge of the front end cover between two adjacent mounting feet protrudes arc panels, and two sides of each arc panel are connected to the two adjacent mounting feet, so that the connection strength between the adjacent mounting feet are enhanced.

11) The rear end cover comprises: the rear bearing seat, and four supporting arms extended from the outer wall of the rear bearing seat. The four supporting arms are arranged in the pattern of the character "X". Two mounting seats are symmetrically disposed at the outer edge of the top surface of the front end cover. Screws pass through the supporting arms and the stator assembly and are inserted into the mounting seats to tightly cooperate with screw nuts whereby fixing the front end cover and the rear end cover on two ends of the housing, respectively. The structure is simple, and the installation thereof is firm.

BRIEF DESCRIPTION OF THE DRAWINGS

The invention is described hereinbelow with reference to the accompanying drawings, in which.

DETAILED DESCRIPTION OF THE EMBODIMENTS

For further illustrating the invention, experiments detailing a structure for mounting a Hall effect sensor of a motor are described below. It should be noted that the following examples are intended to describe and not to limit the invention.

Figure 1:
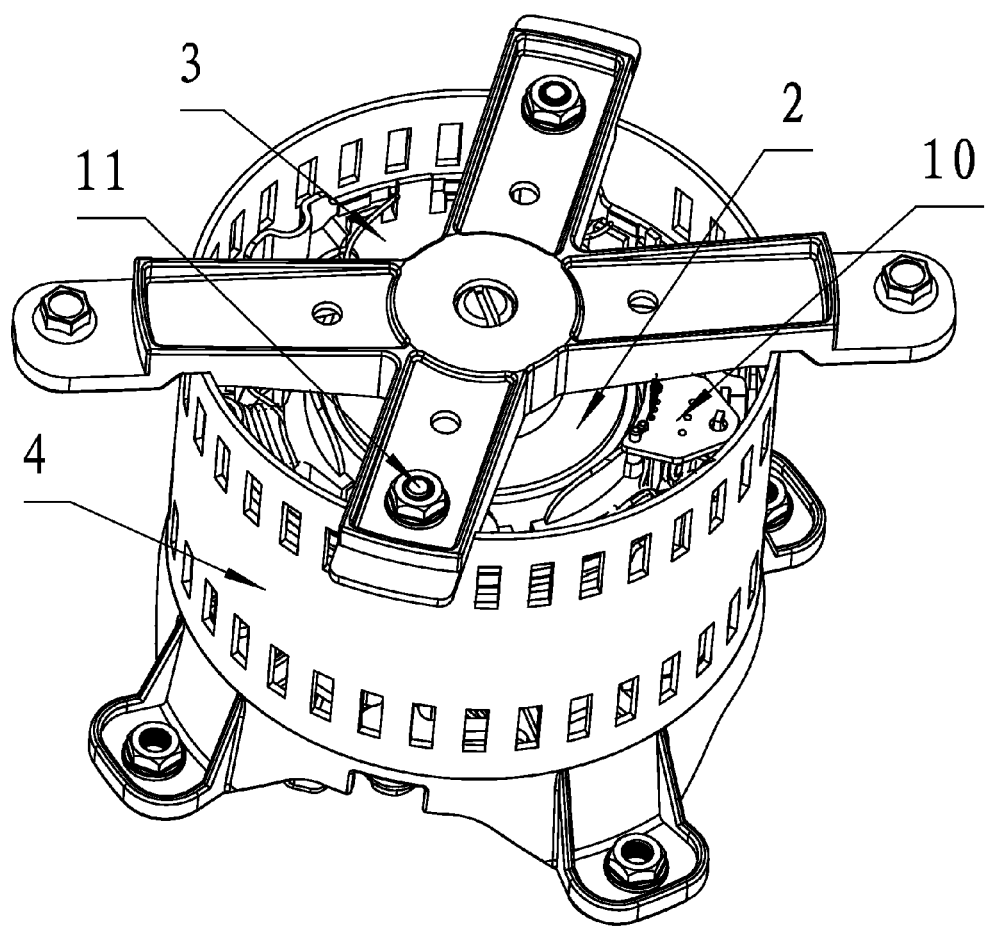
FIG. 1 is a stereogram of a motor in accordance with one embodiment of the invention.
Figure 2:
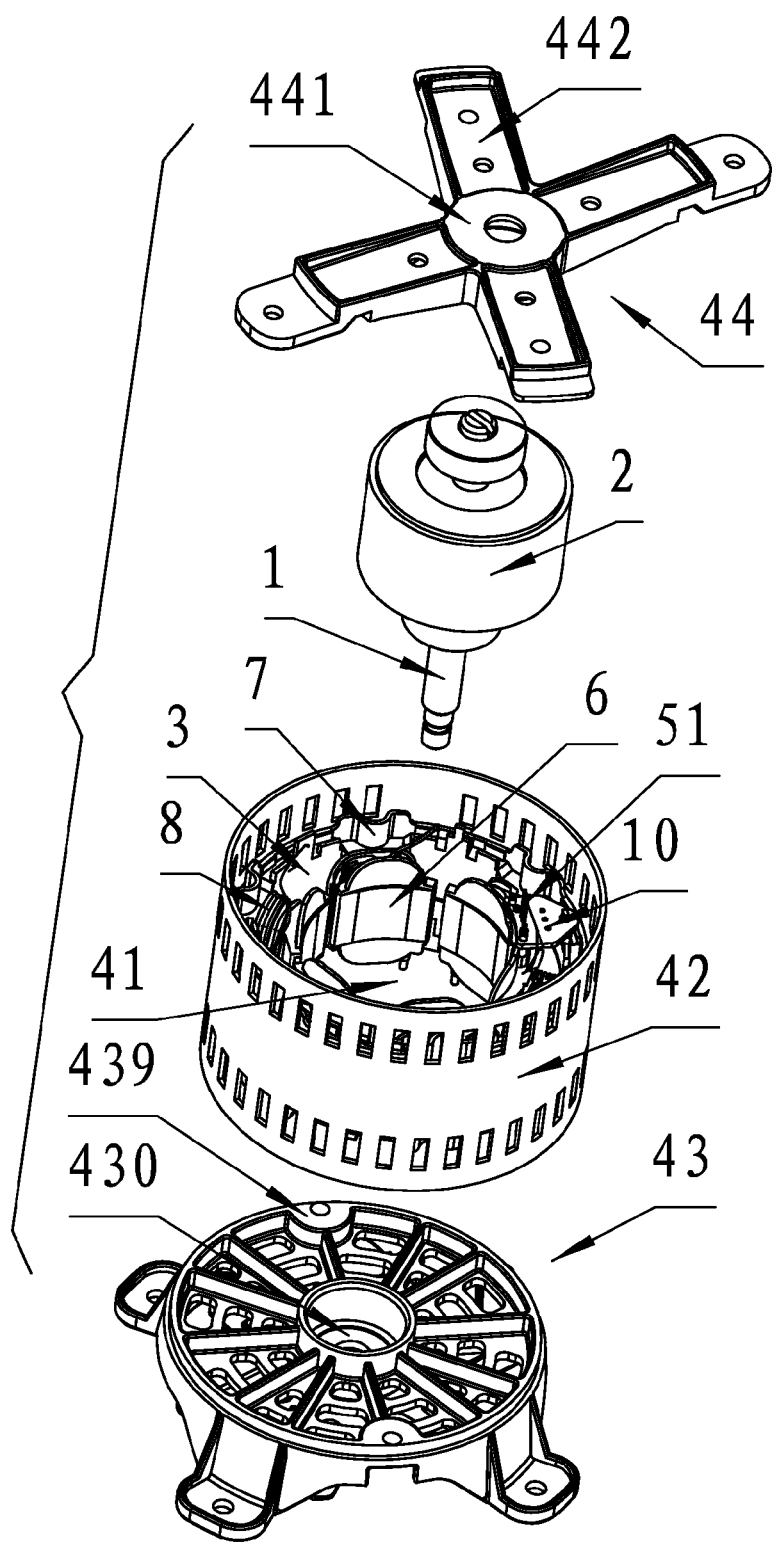
FIG. 2 is an exploded view of a motor in accordance with one embodiment of the invention.
Figure 3:
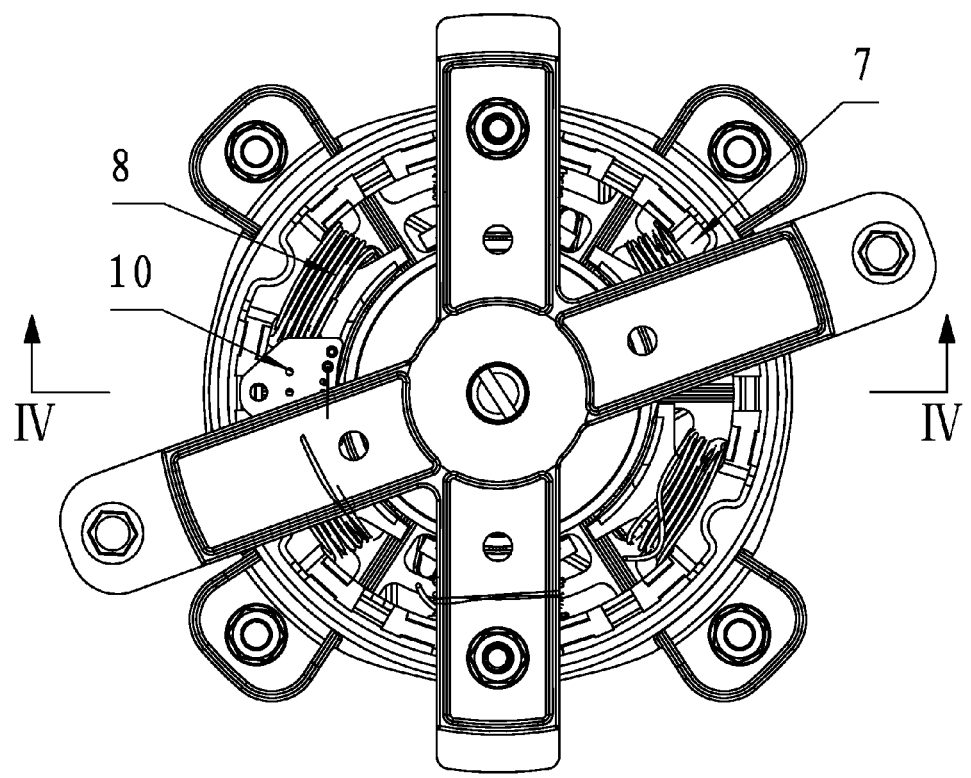
FIG. 3 is a top view of a motor in accordance with one embodiment of the invention.
Figure 4:
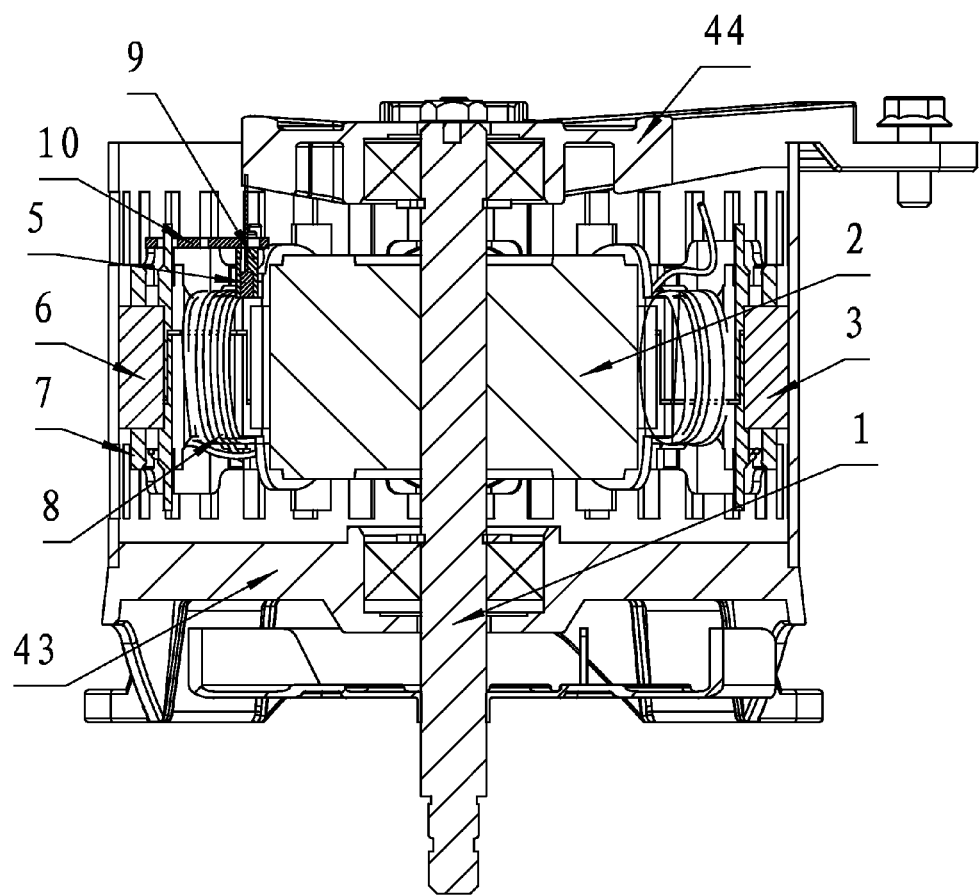
FIG. 4 is a sectional-view taken from line G-G of FIG. 3.
Figure 5:
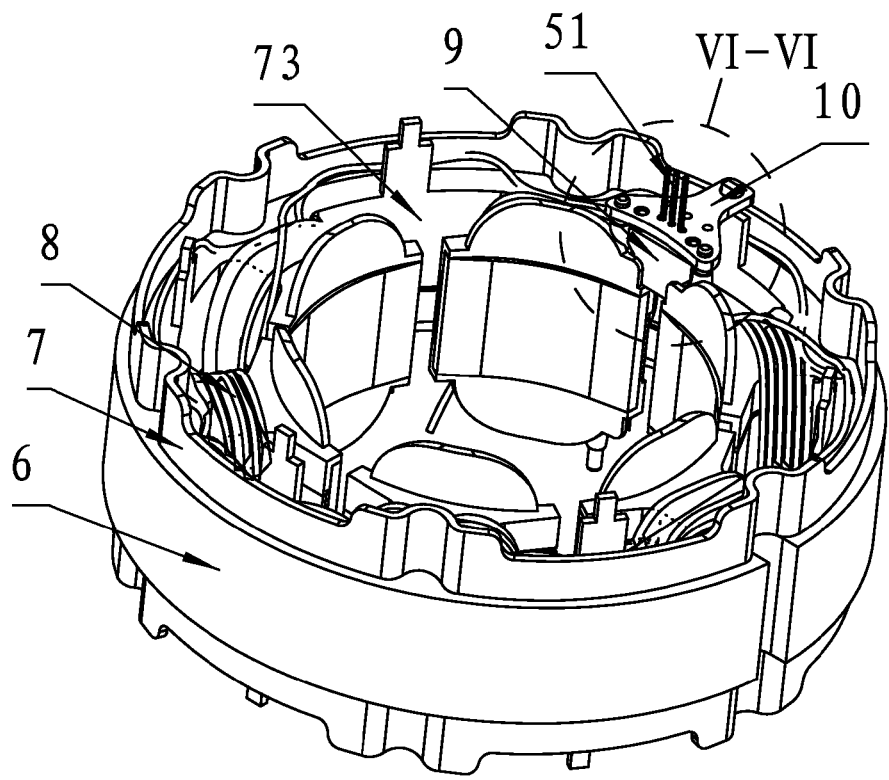
FIG. 5 is a stereogram of a stator assembly in accordance with one embodiment of the invention.
Figure 6:
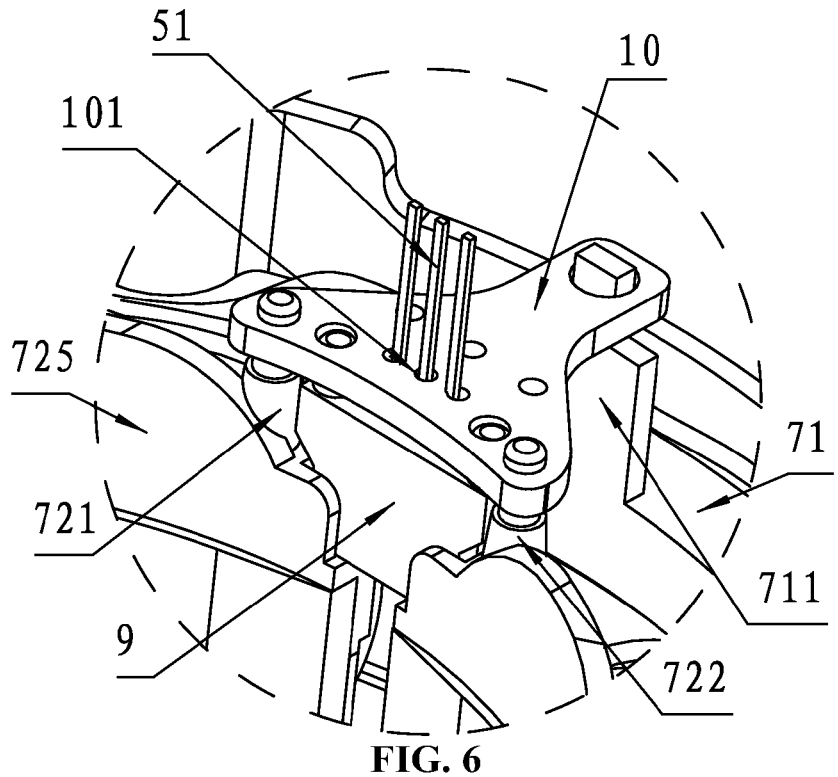
FIG. 6 is an enlarged view of part A-A of FIG. 5.
Figure 7:
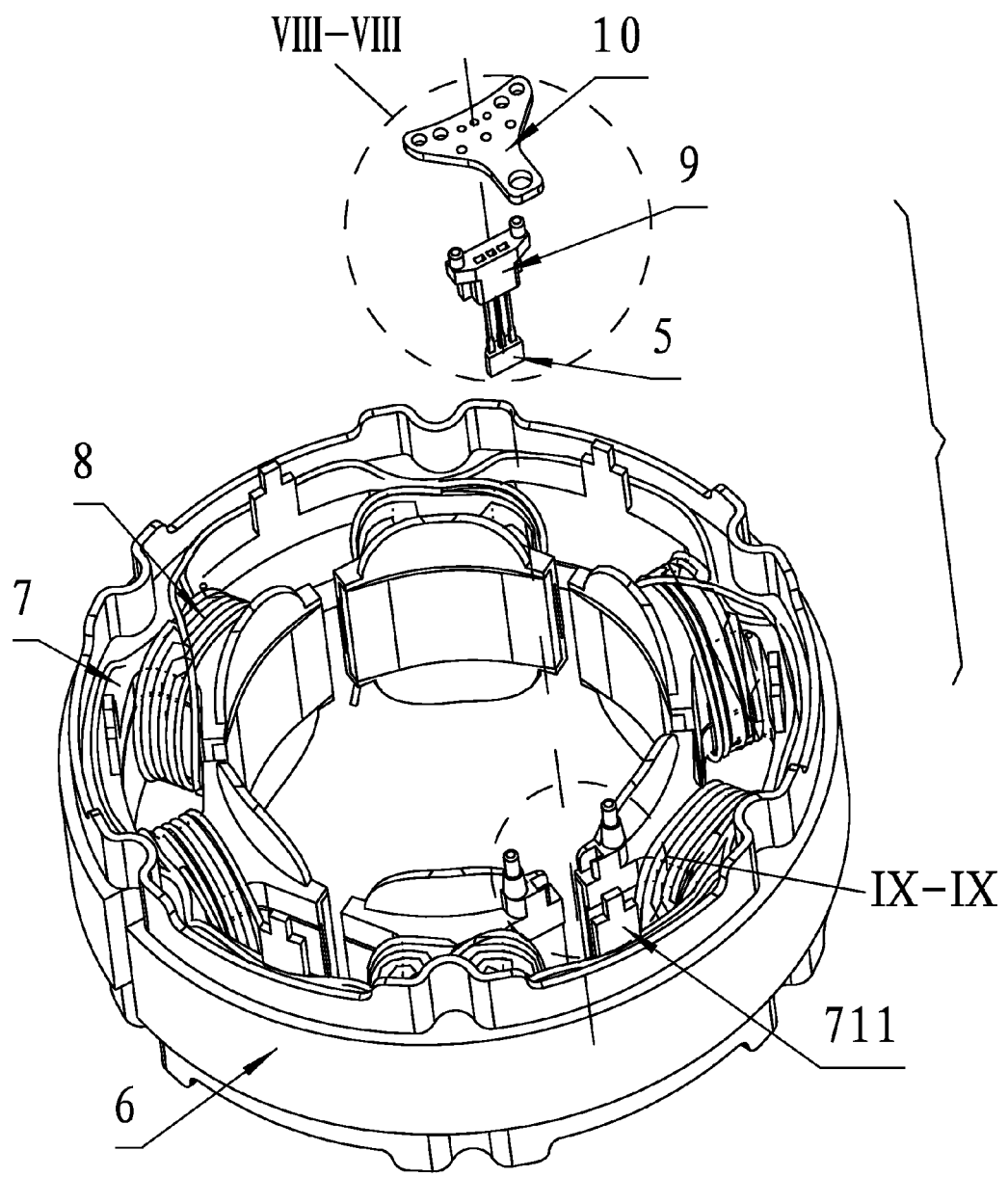
FIG. 7 is an exploded view of a stator assembly in accordance with one embodiment of the invention.
Figure 8:
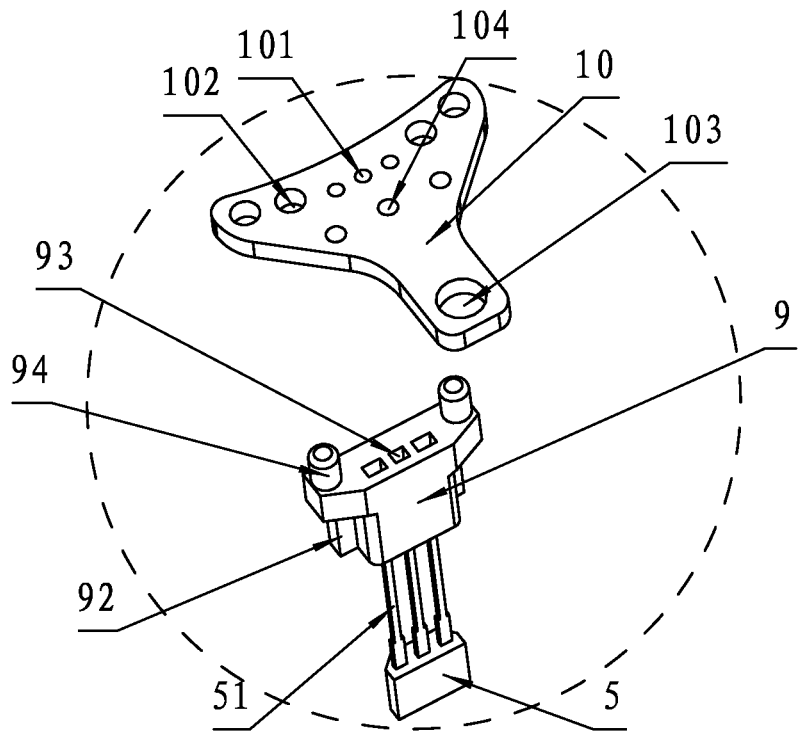
FIG. 8 is an enlarged view of part B-B of FIG. 7.
Figure 9:
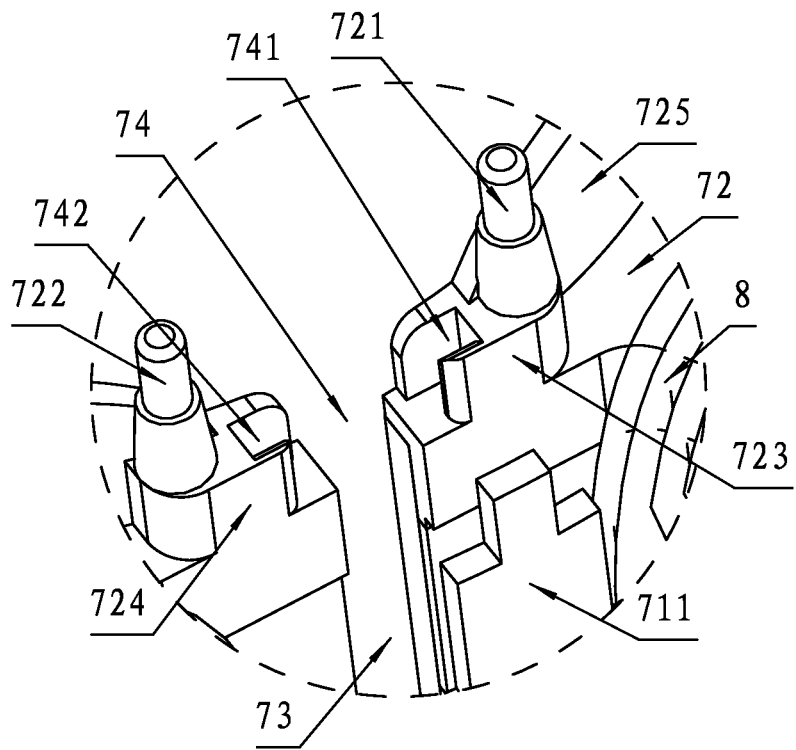
FIG. 9 is an enlarged view of part C-C of FIG. 7.
Figure 10:
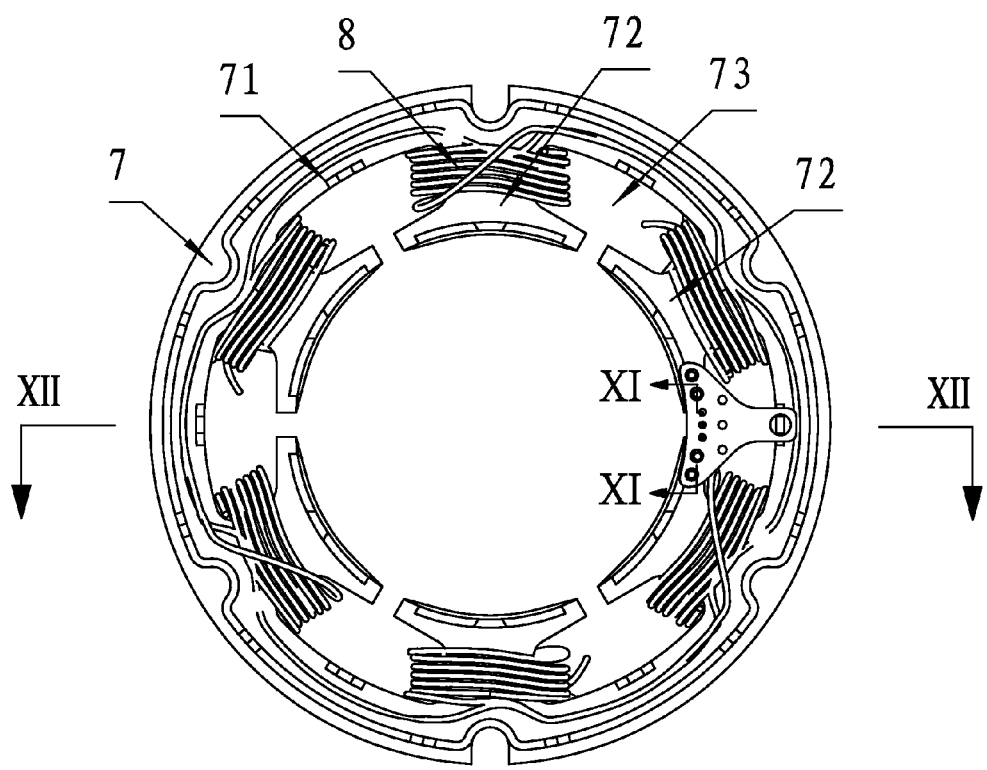
FIG. 10 is a top view of a stator assembly in accordance with one embodiment of the invention.
Figure 11:
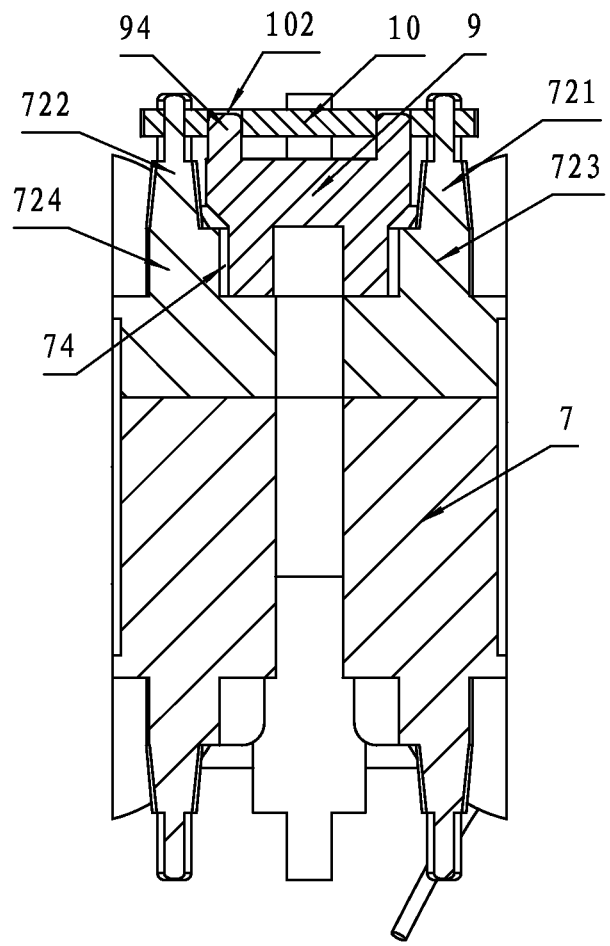
FIG. 11 is a sectional view taken from line D-D of FIG. 10.
Figure 12:
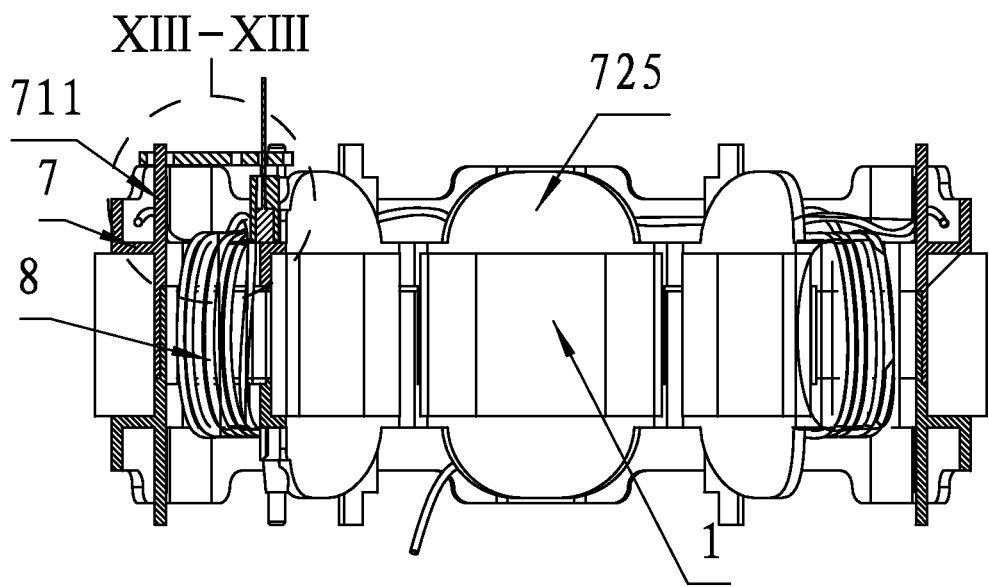
FIG. 12 is a sectional view taken from line E-E of FIG. 10.
Figure 13:
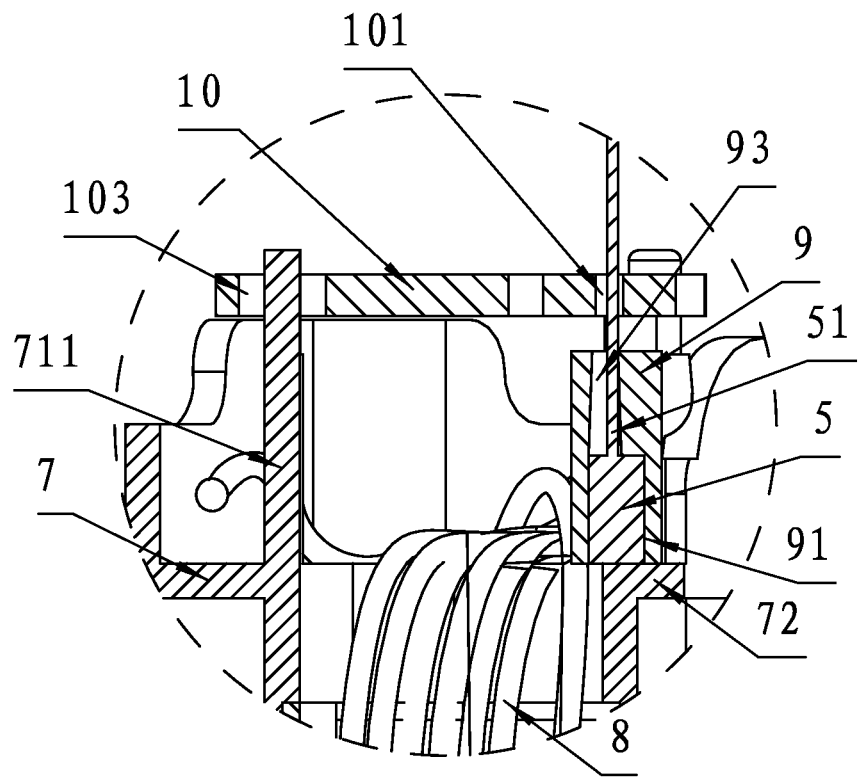
FIG. 13 is an enlarged view of part F-F of FIG. 12.
Figure 14:
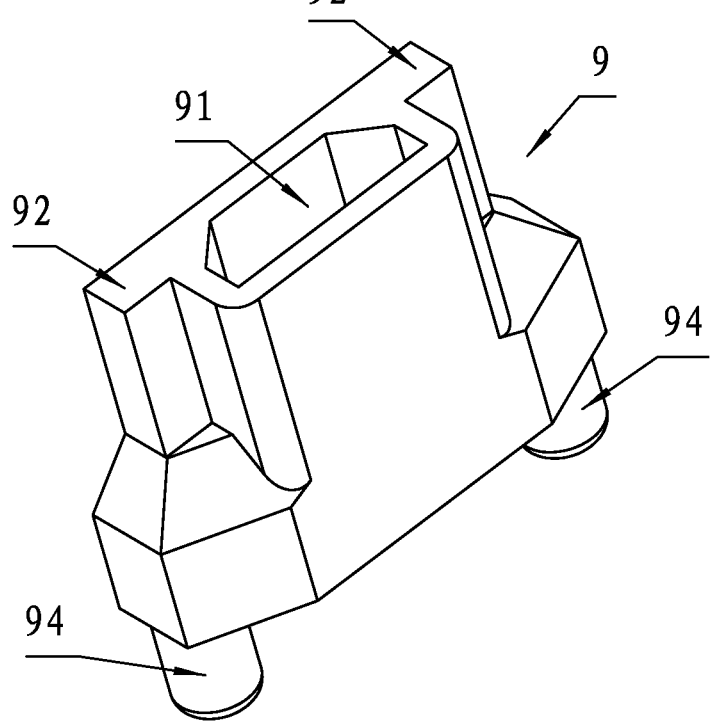
FIG. 14 is a stereogram of a mounting bracket in accordance with one embodiment of the invention.
Figure 15:
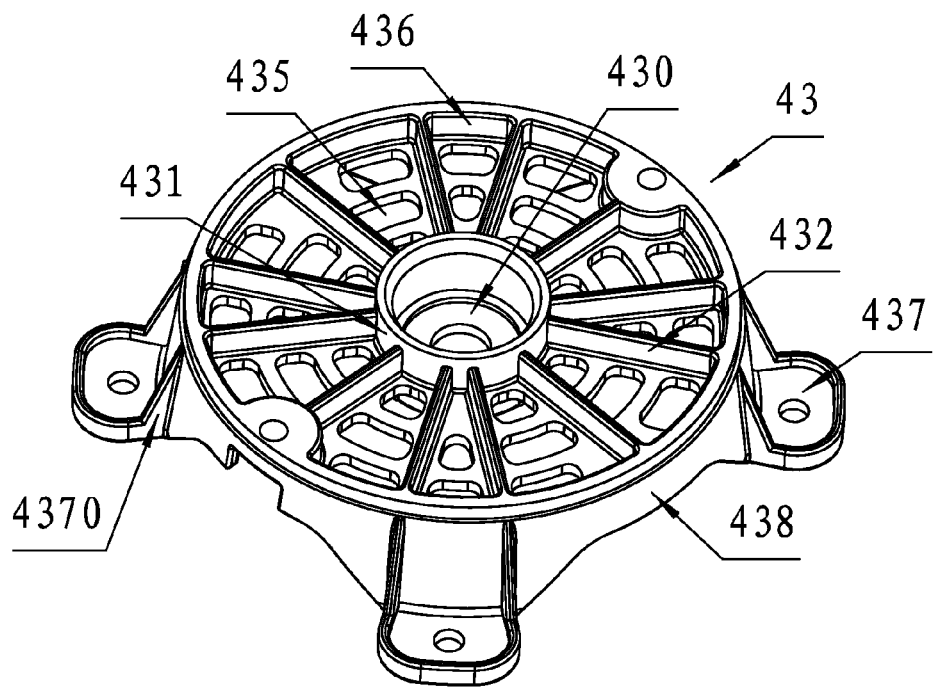
FIG. 15 is a first stereogram of a front end cover in accordance with one embodiment of the invention.
Figure 16:
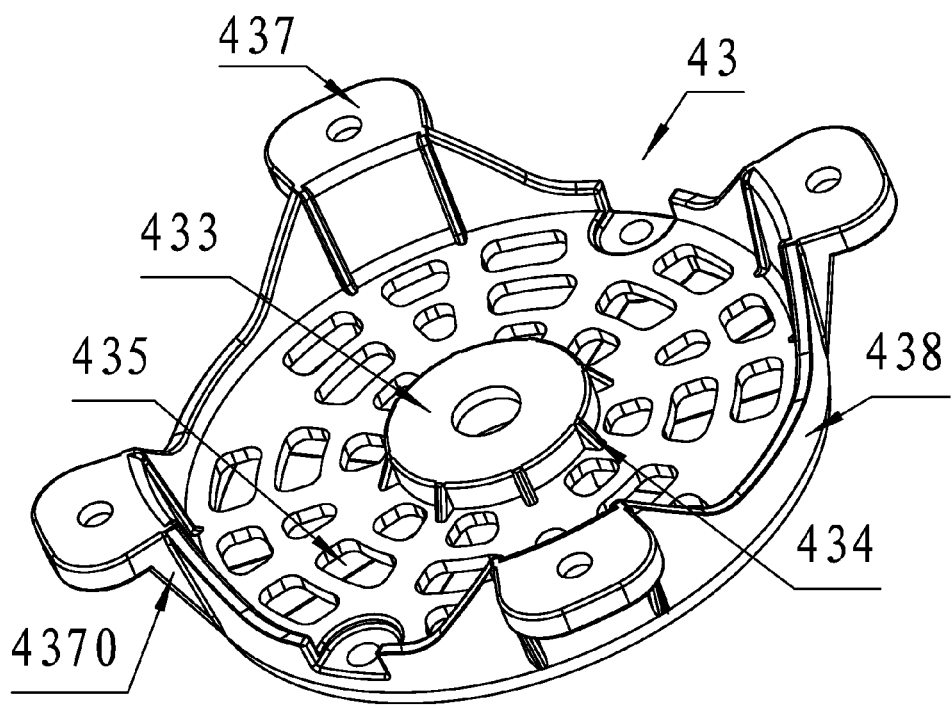
FIG. 16 is a second stereogram of a front end cover in accordance with one embodiment of the invention.

A structure for mounting a Hall effect sensor of a motor is illustrated in FIG. 1-16. The motor comprises: a rotating shaft 1, a rotor assembly 2, a stator assembly 3, a housing assembly 4, a Hall effect sensor 5. The rotor assembly 2 is disposed on the rotating shaft 1. The rotor assembly 2 is nested within the stator assembly 2. A cavity 41 is disposed in the middle of the housing assembly 4; and the rotor assembly 2 and the stator assembly 3 are mounted in the cavity 41 of the housing assembly. The stator assembly 3 comprises: an iron core 6, an end insulation 7, and coil windings 8. The end insulation 7 is disposed on an end part of the iron core 6, and the coil windings 8 are wound on the end insulation 7. The end insulation 7 comprises: a circular yoke 71, a plurality of teeth 72 protruded inwards from the circular yoke 71, and winding slots 73 formed between two adjacent teeth 72. A left supporting column 721 and a right supporting column 722 are protruded upwards from top surfaces of two adjacent teeth 72 at an inner side of a certain winding slot 73, respectively. A first supporting column 711 is protruded upwards from a top surface of the circular yoke 71 at an outer side of the winding slot 73. The mounting plate 10 is disposed on top surfaces of the first supporting column 711, the left supporting column 721, and the right supporting column 722. The mounting bracket 9 is installed at a bottom of the mounting plate 10. The Hall effect sensor 5 is installed in the mounting bracket 9.

The mounting bracket 9 comprises a second cavity 91 at a bottom thereof, and the Hall effect sensor 5 is embedded in the second cavity 91. A left base 723 is disposed at a bottom of the left supporting column 721 on the top surface of one tooth 72. A right base 722 is disposed at a bottom of the right supporting column 722 on the top surface of an adjacent tooth 72. A mounting slot 74 is formed between the left base 723 and the right base 724. The mounting bracket 9 is embedded in the mounting slot 74 and disposed on the top surfaces of the teeth 72. An inner wall of the mounting slot 74, the left base 723, and the right base 724 form a left neck 741 and a right neck 742. Two sides of the mounting bracket 9 are convex to form two fixture blocks 92. The mounting bracket 9 is nested in the mounting slot 74, and the fixture blocks 92 on the two sides of the mounting bracket 9 are locked in the left neck 741 and the right neck 742, respectively.

A plurality of first through holes 93 is disposed at a top of the mounting bracket 9 and communicates with the second cavity 91. A plurality of second through holes 101 is disposed on the mounting plate 10 for communicating with the first through holes 93. The Hall effect sensor 5 is embedded in the second cavity 91, and pins 51 of the Hall effect sensor 5 pass through the first through holes 93 and the second through holes 101 and are in electric connection with an external device. A plurality of positioning columns 94 is protruded from a top surface of the mounting bracket 9. The mounting plate 10 comprises mounting holes 102. The mounting bracket 9 is mounted at a bottom of the mounting plate 10 by assembling the positioning columns 94 with the mounting holes 102. The mounting plate 10 comprises a plurality of positioning holes 103, and the mounting plate 10 is disposed on the top surfaces of the first supporting column 711, the left supporting column 721, and the right supporting column 722 by assembling the positioning holes 103 with the first supporting column 711, the left supporting column 721, and the right supporting column 722. The mounting plate 10 also comprises a plurality of lead through holes 104. An inner side panel 725 is protruded upwards from an inner edge of the top surface of each tooth 72. The left base 723 and the right base 724 are connected to corresponding inner side panels 725, respectively.

The housing assembly 4 comprises: a housing 42, a front end cover 43 and a rear end cover 44 disposed at two ends of the housing 42, respectively. A middle of a top surface of the front end cover 43 is protruded upwards to form an upper bearing seat 431. A bearing cavity 430 is disposed in the upper bearing seat 431. An outer wall of the upper bearing seat 431 is provided with a plurality of first stiffeners 432. A bottom wall of the bearing cavity 430 is convex downwards from a bottom surface of the front end cover 43 and forms a lower bearing seat 433. An outer wall of the lower bearing seat 433 is provided with a plurality of second stiffeners 434. The first stiffeners 432 are radially disposed on the top surface of the front end cover 43. A plurality of through holes 435 for heat dissipation is radially arranged between two adjacent first stiffeners 432. An annular boss 436 is disposed on an outer edge of the top surface of the front end cover 43, and two ends of the first stiffeners 432 are connected to the outer wall of the upper bearing seat 431 and the annular boss 436.

An outer edge of the front end cover 43 protrudes a plurality of mounting feet 437, two sides of the mounting feet 437 are provided with third stiffeners 4370, and the third stiffeners 4370 are connected to the outer edge of the front end cover 43. The number of the mounting feet 437 is four; the mounting feet 437 are radially disposed on the outer edge of the front end cover 43. The outer edge of the front end cover 43 between two adjacent mounting feet 437 protrudes arc panels 438, and two sides of each arc panel 438 are connected to the two adjacent mounting feet 437. The rear end cover 44 comprises: a rear bearing seat 441, and four supporting arms 442 extended from an outer wall of the rear bearing seat 441. The four supporting arms 442 are arranged in a pattern of the character "X". Two mounting seats 439 are symmetrically disposed at the outer edge of the top surface of the front end cover 43. Screws 11 pass through the supporting arms 442 and the stator assembly 3 and are inserted into the mounting seats 439 to tightly cooperate with screw nuts whereby mounting the front end cover 43 and the rear end cover 44 on two ends of the housing 42, respectively.

The principle of the structure for installing the Hall effect sensor is as follows: A left supporting column 721 and a right supporting column 722 are protruded upwards from top surfaces of two adjacent teeth 72 at an inner side of a certain winding slot 73, respectively. A first supporting column 711 is protruded upwards from a top surface of the circular yoke 71 at an outer side of the winding slot 73. The mounting plate 10 is disposed on top surfaces of the first supporting column 711, the left supporting column 721, and the right supporting column 722. The mounting bracket 9 is installed at a bottom of the mounting plate 10. The Hall effect sensor 5 is installed in the mounting bracket 9. The structure is simple and compact, the mounting plate, the mounting bracket, and the Hall effect sensor forms an assembled structure and the assembled structure is installed on the end insulation, thereby featuring good integrity, convenient and firm installation, and high reliability. The creepage distance between the Hall effect sensor and the coil windings are enlarged, and the Hall effect sensor is able to resist high voltage and difficult to breakdown.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A structure for mounting a Hall effect sensor of a motor, the motor comprising:
   a) a rotating shaft;
   b) a rotor assembly;
   c) a stator assembly, the stator assembly comprising an iron core, an end insulation, and coil windings; the end insulation comprising a circular yoke, a plurality of teeth, and winding slots;
   d) a housing assembly, the housing assembly comprising a first cavity; and
   e) a Hall effect sensor;
   wherein
      the rotor assembly is disposed on the rotating shaft, the rotor assembly is nested within the stator assembly, and the rotor assembly and the stator assembly are disposed in the first cavity of the housing assembly; the end insulation is disposed on an end part of the iron core, the coil windings are wound on the end insulation; and the teeth are protruded inwards from the circular yoke, and winding slots are formed between two adjacent teeth; the structure for mounting the Hall effect sensor comprises:
   f) a mounting bracket,
   g) a mounting plate,
   h) a left supporting column,
   i) a right supporting column, and
   j) a first supporting column;
      the left supporting column and the right supporting column are protruded upwards from top surfaces of two adjacent teeth at an inner side of a certain winding slot, respectively; the first supporting column is protruded upwards from a top surface of the circular yoke at an outer side of the winding slot; the mounting plate is disposed on top surfaces of the first supporting column, the left supporting column, and the right supporting column; the mounting bracket is installed at a bottom of the mounting plate; and the Hall effect sensor is installed in the mounting bracket.

2. The structure of claim 1, wherein the mounting bracket comprises a second cavity at a bottom thereof, and the Hall effect sensor is embedded in the second cavity.

3. The structure of claim 1, wherein a left base is disposed at a bottom of the left supporting column on the top surface of one tooth; a right base is disposed at a bottom of the right supporting column on the top surface of an adjacent tooth; a mounting slot is formed between the left base and the right base; and the mounting bracket is embedded in the mounting slot and disposed on the top surfaces of the teeth.

4. The structure of claim 2, wherein a left base is disposed at a bottom of the left supporting column on the top surface of one tooth; a right base is disposed at a bottom of the right supporting column on the top surface of an adjacent tooth; a mounting slot is formed between the left base and the right base; and the mounting bracket is embedded in the mounting slot and disposed on the top surfaces of the teeth.

5. The structure of claim 3, wherein
   an inner wall of the mounting slot, the left base, and the right base form a left neck and a right neck;
   two sides of the mounting bracket are convex to form two fixture blocks; and
   the mounting bracket is nested in the mounting slot, and the fixture blocks on the two sides of the mounting bracket are locked in the left neck and the right neck, respectively.

6. The structure of claim 4, wherein
   an inner wall of the mounting slot, the left base, and the right base form a left neck and a right neck;
   two sides of the mounting bracket are convex to form two fixture blocks; and the mounting bracket is nested in the mounting slot, and the fixture blocks on the two sides of the mounting bracket are locked in the left neck and the right neck, respectively.

7. The structure of claim 2, wherein
a plurality of first through holes is disposed at a top of the mounting bracket and communicates with the second cavity;
a plurality of second through holes is disposed on the mounting plate for communicating with the first through holes; and
the Hall effect sensor is embedded in the second cavity, and pins of the Hall effect sensor pass through the first through holes and the second through holes and are in electric connection with an external device.

8. The structure of claim 1, wherein a plurality of positioning columns is protruded from a top surface of the mounting bracket; the mounting plate comprises mounting holes; the mounting bracket is mounted at a bottom of the mounting plate by assembling the positioning columns with the mounting holes; the mounting plate comprises a plurality of positioning holes, and the mounting plate is disposed on the top surfaces of the first supporting column, the left supporting column, and the right supporting column by assembling the positioning holes with the first supporting column, the left supporting column, and the right supporting column; and the mounting plate also comprises a plurality of lead through holes.

9. The structure of claim 2, wherein a plurality of positioning columns is protruded from a top surface of the mounting bracket; the mounting plate comprises mounting holes; the mounting bracket is mounted at a bottom of the mounting plate by assembling the positioning columns with the mounting holes; the mounting plate comprises a plurality of positioning holes, and the mounting plate is disposed on the top surfaces of the first supporting column, the left supporting column, and the right supporting column by assembling the positioning holes with the first supporting column, the left supporting column, and the right supporting column; and the mounting plate also comprises a plurality of lead through holes.

10. The structure of claim 1, wherein the housing assembly comprises: a housing, a front end cover and a rear end cover disposed at two ends of the housing, respectively; a middle of a top surface of the front end cover is protruded upwards to form an upper bearing seat; a bearing cavity is disposed in the upper bearing seat; an outer wall of the upper bearing seat is provided with a plurality of first stiffeners; a bottom wall of the bearing cavity is convex downwards from a bottom surface of the front end cover and forms a lower bearing seat; and an outer wall of the lower bearing seat is provided with a plurality of second stiffeners.

11. The structure of claim 2, wherein the housing assembly comprises: a housing, a front end cover and a rear end cover disposed at two ends of the housing, respectively; a middle of a top surface of the front end cover is protruded upwards to form an upper bearing seat; a bearing cavity is disposed in the upper bearing seat; an outer wall of the upper bearing seat is provided with a plurality of first stiffeners; a bottom wall of the bearing cavity is convex downwards from a bottom surface of the front end cover and forms a lower bearing seat; and an outer wall of the lower bearing seat is provided with a plurality of second stiffeners.

12. The structure of claim 10, wherein an outer edge of the front end cover protrudes a plurality of mounting feet, two sides of the mounting feet are provided with third stiffeners, and the third stiffeners are connected to the outer edge of the front end cover.

13. The structure of claim 11, wherein an outer edge of the front end cover protrudes a plurality of mounting feet, two sides of the mounting feet are provided with third stiffeners, and the third stiffeners are connected to the outer edge of the front end cover.

14. The structure of claim 10, wherein the rear end cover comprises: a rear bearing seat, and four supporting arms extended from an outer wall of the rear bearing seat; the four supporting arms are arranged in a pattern of the character "X"; two mounting seats are symmetrically disposed at the outer edge of the top surface of the front end cover; and screws pass through the supporting arms and the stator assembly and are inserted into the mounting seats to tightly cooperate with screw nuts whereby fixing the front end cover and the rear end cover on two ends of the housing, respectively.

15. The structure of claim 11, wherein the rear end cover comprises: a rear bearing seat, and four supporting arms extended from an outer wall of the rear bearing seat; the four supporting arms are arranged in a pattern of the character "X"; two mounting seats are symmetrically disposed at the outer edge of the top surface of the front end cover; and screws pass through the supporting arms and the stator assembly and are inserted into the mounting seats to tightly cooperate with screw nuts whereby fixing the front end cover and the rear end cover on two ends of the housing, respectively.

* * * * *